(12) United States Patent
Hung et al.

(10) Patent No.: US 11,910,642 B2
(45) Date of Patent: Feb. 20, 2024

(54) DISPLAY APPARATUS

(71) Applicant: Au Optronics Corporation, Hsinchu (TW)

(72) Inventors: Chun-Cheng Hung, Hsinchu (TW); Zhu-Hang Wu, Hsinchu (TW); Che-Yuan Chang, Hsinchu (TW); Chee-Wai Lau, Hsinchu (TW); Mao-Hsun Cheng, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 196 days.

(21) Appl. No.: 17/185,867

(22) Filed: Feb. 25, 2021

(65) Prior Publication Data

US 2021/0351383 A1 Nov. 11, 2021

(30) Foreign Application Priority Data

May 6, 2020 (TW) .................................. 109115047

(51) Int. Cl.
*H10K 50/86* (2023.01)
*H10K 50/844* (2023.01)
*H10K 59/121* (2023.01)

(52) U.S. Cl.
CPC ......... *H10K 50/865* (2023.02); *H10K 50/844* (2023.02); *H10K 59/121* (2023.02)

(58) Field of Classification Search
CPC ............... H01L 27/326; H01L 27/3244; H01L 51/5253; H01L 51/5284; H01L 51/5281; H01L 51/525; H10K 59/12; H10K 59/121; H10K 50/865; H10K 50/8428; H10K 50/844; H10K 50/86
See application file for complete search history.

(56) References Cited

U.S. PATENT DOCUMENTS 9,704,892 B2 7/2017 Lai et al.
10,613,400 B2 4/2020 Lai et al.
10,705,639 B2 7/2020 Hung et al.
(Continued)

FOREIGN PATENT DOCUMENTS

TW 201629587 8/2016
TW 201935727 9/2019
TW I674525 10/2019

*Primary Examiner* — Vongsavanh Sengdara
(74) *Attorney, Agent, or Firm* — JCIPRNET

(57) ABSTRACT

A display apparatus includes a first substrate, a pixel structure, a second substrate, and an anti-reflection structure. The pixel structure is disposed on the first substrate, and has an active element and a pixel electrode electrically connected to the active element. The second substrate is disposed opposite to the first substrate. The anti-reflection structure is disposed on the second substrate and is located between the first substrate and the second substrate. The anti-reflection structure includes a first insulating layer and a metal layer. The first insulating layer is disposed on the second substrate. The metal layer is disposed on the first insulating layer. The first insulating layer is located between the second substrate and the metal layer. The first insulating layer has an opening, the metal layer has an opening, and the opening of the first insulating layer and the opening of the metal layer overlap with the pixel electrode.

10 Claims, 9 Drawing Sheets

(56) References Cited

U.S. PATENT DOCUMENTS

| | | | |
|---|---|---|---|
| 2016/0233236 A1 | 8/2016 | Lai et al. | |
| 2017/0186971 A1* | 6/2017 | Kanamoto | H10K 85/6572 |
| 2017/0235196 A1 | 8/2017 | Lai et al. | |
| 2017/0338289 A1* | 11/2017 | Seo | H10K 59/88 |
| 2019/0051709 A1* | 2/2019 | Puszka | H10K 59/40 |
| 2020/0057520 A1* | 2/2020 | Hung | H10K 59/131 |
| 2020/0058888 A1* | 2/2020 | Sugiyama | H05B 33/12 |
| 2020/0066804 A1* | 2/2020 | Jung | H10K 59/38 |
| 2020/0194728 A1* | 6/2020 | Kim | G02B 1/118 |
| 2020/0272265 A1* | 8/2020 | Liu | H10K 59/40 |
| 2020/0343315 A1* | 10/2020 | Lin | H10K 59/35 |
| 2021/0005845 A1* | 1/2021 | Kim | G06F 3/0446 |
| 2021/0036060 A1* | 2/2021 | Cho | H10K 30/87 |
| 2021/0225942 A1* | 7/2021 | Suzuki | G09F 9/00 |
| 2022/0115468 A1* | 4/2022 | Huang | H10K 59/123 |

* cited by examiner

DISPLAY APPARATUS

CROSS-REFERENCE TO RELATED APPLICATION

This application claims the priority benefit of Taiwan application serial no. 109115047, filed on May 6, 2020. The entirety of the above-mentioned patent application is hereby incorporated by reference herein and made a part of this specification.

BACKGROUND

Technical Field

The disclosure relates to an optoelectronic apparatus, and more particularly to a display apparatus.

Description of Related Art

In the technical field of organic light-emitting diodes, the active matrix organic light-emitting diode (AMOLED) is widely used in the display panels of various electronic apparatus. Among them, the top-view active matrix organic light-emitting diode structure (top-view OLED) is more common because of having a higher aperture ratio and not being affected by the increase in the number of thin film transistors. However, since the top-view OLED structure has a highly reflective metal layer, it is necessary to attach a circular polarizer to the package cover to reduce the reflection of ambient light beams, so as to prevent the contrast from being affected.

In some electronic apparatus (e.g., a watch, a mobile phone), the display panel has a perspective window, and the circular polarizer attached to the outside of the package cover of the display panel also has a corresponding opening. In consideration of tolerances, the size of the opening of the circular polarizer is slightly larger than the size of the perspective window of the display panel. Therefore, when the circular polarizer is attached to the display panel, a region between the perspective window of the display panel and the opening of the circular polarizer is not covered by the circular polarizer. When the display panel is illuminated, the region not covered by the circular polarizer and a region covered by the circular polarizer present obviously different visual effects, which affects the quality of the electronic apparatus.

SUMMARY

The disclosure provides a display apparatus which has an exceptional visual effect.

A display apparatus of the disclosure includes a first substrate, a pixel structure, a second substrate, and an anti-reflection structure. The pixel structure is disposed on the first substrate, and has an active element and a pixel electrode electrically connected to the active element. The second substrate is disposed opposite to the first substrate. The anti-reflection structure is disposed on the second substrate, and is located between the first substrate and the second substrate. The anti-reflection structure includes a first insulating layer and a metal layer. The first insulating layer is disposed on the second substrate. The metal layer is disposed on the first insulating layer. The first insulating layer is located between the second substrate and the metal layer. The first insulating layer has an opening, the metal layer has an opening, and the opening of the first insulating layer and the opening of the metal layer overlap with the pixel electrode.

In an embodiment of the disclosure, the opening of the first insulating layer and the opening of the metal layer are substantially aligned.

In an embodiment of the disclosure, a material of the first insulating layer includes molybdenum oxide or silicon-rich oxide, and a material of the metal layer includes molybdenum.

In an embodiment of the disclosure, the anti-reflection structure further includes a second insulating layer disposed on the metal layer. The metal layer is located between the first insulating layer and the second insulating layer.

In an embodiment of the disclosure, the second insulating layer has an opening, and the opening of the second insulating layer overlaps with the opening of the metal layer.

In an embodiment of the disclosure, the opening of the second insulating layer and the opening of the metal layer are substantially aligned.

In an embodiment of the disclosure, a material of one of the first insulating layer and the second insulating layer includes silicon nitride, a material of the other one of the first insulating layer and the second insulating layer includes silicon-rich oxide, and a material of the metal layer includes molybdenum.

In an embodiment of the disclosure, a material of the first insulating layer includes silicon-rich oxide, a material of the metal layer includes molybdenum, and a material of the second insulating layer includes silicon-rich oxide.

In an embodiment of the disclosure, a thickness of the metal layer is greater than a thickness of the first insulating layer.

In an embodiment of the disclosure, the display apparatus further includes a protection layer disposed on the anti-reflection structure and located between the anti-reflection structure and the first substrate. The protection layer is further disposed in the opening of the first insulating layer and the opening of the metal layer.

DESCRIPTION OF THE EMBODIMENTS

Figure 1:
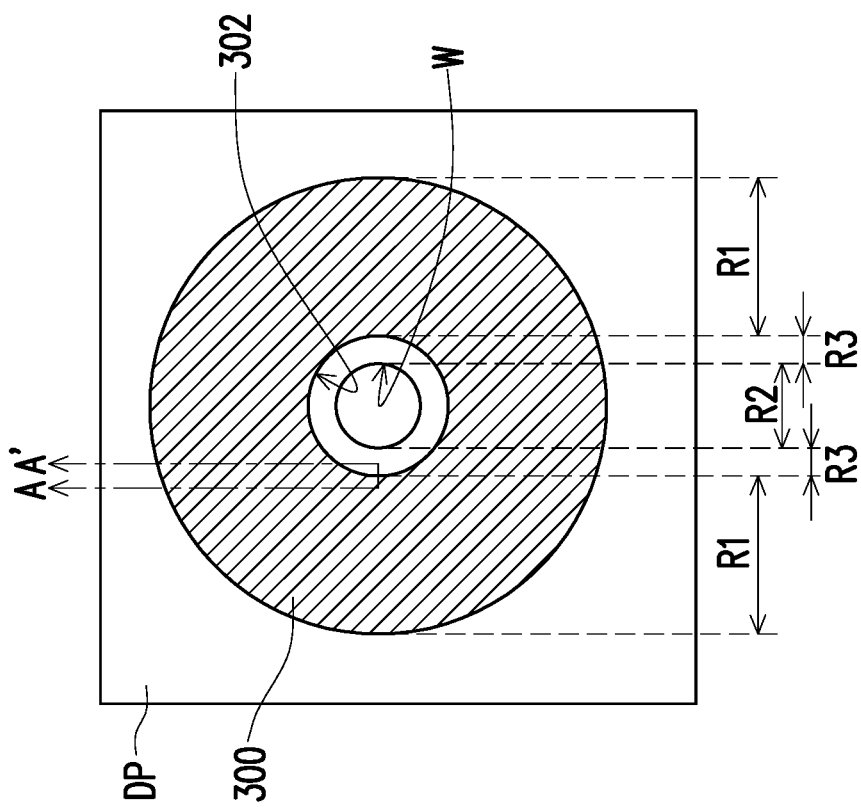
FIG. 1 is a schematic top view of a display apparatus 10 according to an embodiment of the disclosure.

Reference will now be made in detail to the exemplary embodiments of the disclosure, examples of which are illustrated in the accompanying drawings. Wherever possible, the same reference numbers are used in the drawings and the description to refer to the same or like parts.

It should be understood that when an element such as a layer, a film, a region, or a substrate is indicated to be "on" another element or "connected to" another element, it may be directly on another element or connected to another element, or an element in the middle may exist. In contrast, when an element is indicated to be "directly on another element" or "directly connected to" another element, an element in the middle does not exist. As used in the present document, "connect" may indicate to physically and/or electrically connect. Furthermore, "electrically connect" or "couple" may be used when other elements exist between two elements.

The usages of "approximately", "similar to", or "substantially" in the present document include the indicated value and an average value within an acceptable deviation range of a certain value confirmed by persons skilled in the art, and is a certain amount in consideration of the discussed measurement and measurement-related deviation (that is, the limitation of the measurement system). For example, "approximately" may indicate to be within one or more standard deviations of the indicated value, or within ±30%, ±20%, ±10%, or ±5%. Furthermore, the usages of "approximately", "similar to", or "substantially" in the present document may refer to a more acceptable deviation scope or standard deviation depending on optical properties, etching properties, or other properties, and all properties may not be applied with one standard deviation.

Unless otherwise defined, all terms (including technical and scientific terms) used in the present document have the same meaning as commonly understood by persons of ordinary skill in the art. In addition, terms such as those defined in commonly used dictionaries should be interpreted as having meanings consistent with their meanings in the context of the related art and the disclosure, and are not interpreted as idealized or excessively formal meanings unless being explicitly defined in the present document.

FIG. 1 is a schematic top view of a display apparatus 10 according to an embodiment of the disclosure.

Figure 2:
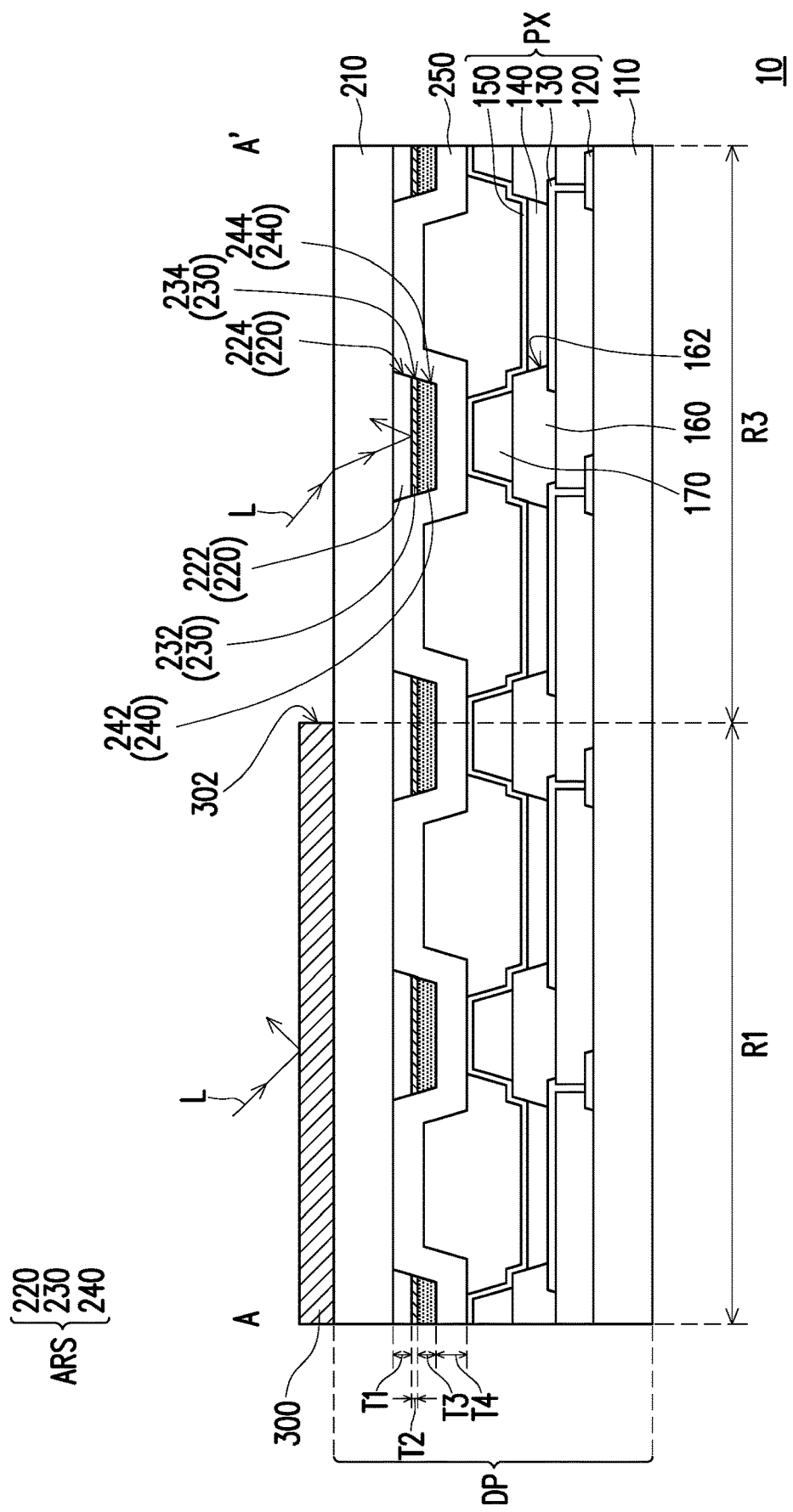
FIG. 2 is a schematic cross-sectional view of the display apparatus 10 according to an embodiment of the disclosure.

FIG. 2 is a schematic cross-sectional view of the display apparatus 10 according to an embodiment of the disclosure. FIG. 2 corresponds to a section line A-A' of FIG. 1.

Referring to FIG. 1 and FIG. 2, the display apparatus 10 includes a display panel DP. The display panel DP includes a first substrate 110, a pixel structure PX, a second substrate 210, and an anti-reflection structure ARS.

In the embodiment, the first substrate 110 is light-transmitting, opaque, or reflective. A material of the first substrate 110 may be glass, quartz, organic polymer, or opaque/reflective materials (e.g., wafer, ceramic), or other applicable materials.

The pixel structure PX is disposed on the first substrate 110. The pixel structure PX has an active element 120 and a pixel electrode 130 electrically connected to the active element 120. The active element 120 may include a thin film transistor. A source of the thin film transistor is electrically connected to a data line (not shown), a gate of the thin film transistor is electrically connected to a scan line (not shown), and a drain of the thin film transistor is electrically connected to the pixel electrode 130.

For example, in the embodiment, the pixel structure PX may further include an organic electroluminescence pattern 140 and a common electrode 150. In the embodiment, the display panel DP further includes a pixel defining layer 160 disposed on the pixel electrode 130, and the pixel defining layer 160 has an opening 162 overlapping with the pixel electrode 130. The organic electroluminescence pattern 140 is disposed on the pixel electrode 130 and located in the opening 162 of the pixel defining layer 160, and the common electrode 150 is disposed on the organic electroluminescence pattern 140.

The pixel electrode 130, the organic electroluminescence pattern 140, and the common electrode 150 can form an organic light-emitting diode element. In other words, the display panel DP of the embodiment may be an organic light-emitting diode display panel. However, the disclosure is not limited thereto. In other embodiments, the pixel structure PX may also be other forms, and the display panel DP may also be other types of displays; for example, in another embodiment, in addition to the active element 120 and the pixel electrode 130, the pixel structure PX may further include a μLED electrically connected to the pixel electrode 130, and the display panel DP may also be a μLED display.

The second substrate 210 is disposed opposite to the first substrate 110. In the embodiment, the second substrate 210 is light-transmitting, and a material of the second substrate 210 may be glass, quartz, organic polymer, or other applicable materials.

The anti-reflection structure ARS is disposed on the second substrate 210, and is located between the first substrate 110 and the second substrate 210.

The anti-reflection structure ARS includes a first insulating layer 220 and a metal layer 230. The first insulating layer 220 is disposed on the second substrate 210. The metal layer 230 is disposed on the first insulating layer 220, and the first insulating layer 220 is located between the second substrate 210 and the metal layer 230. In the embodiment, the anti-reflection structure ARS may optionally further include a second insulating layer 240, and the second insulating layer 240 is disposed on the metal layer 230. The metal layer 230 is located between the first insulating layer 220 and the second insulating layer 240.

For example, in the embodiment, a material of the first insulating layer 220 includes silicon nitride ($SiN_x$), a material of the metal layer 230 includes molybdenum (Mo), and a material of the second insulating layer 240 includes silicon-rich oxide (SRO). A refractive index of $SiN_x$ ranges from 1.85 to 1.91, and a refractive index of SRO ranges from 3.33 to 3.39; a thickness T1 of the first insulating layer 220 is 300 Å, a thickness T2 of the metal layer 230 is 105 Å, and a thickness T3 of the second insulating layer 240 is 300 Å; however, the disclosure is not limited thereto.

It should be noted that the first insulating layer 220 and the metal layer 230 of the anti-reflection structure ARS respectively have an opening 224 and an opening 234, and the opening 224 of the first insulating layer 220 and the opening 234 of the metal layer 230 overlap with the pixel electrode 130. The opening 224 and the opening 234 may be enclosed openings. In the embodiment, the second insulating layer 240 may also have an opening 244, and the opening 244 of the second insulating layer 240 overlaps with the opening 234 of the metal layer 230. The opening 244 may be an enclosed opening.

From another perspective, in the embodiment, the first insulating layer 220, the metal layer 230, and the second insulating layer 240 respectively have a physical part 222, a physical part 232, and a physical part 242, and the physical part 222 of the first insulating layer 220, the physical part 232 of the metal layer 230, and the physical part 242 of the second insulating layer 240 do not cover a light-emitting region where the pixel electrode 130 is located. Specifically, in the embodiment, the display panel DP further includes a spacer 170 disposed on the pixel defining layer 160. The spacer 170 can be against a stacked structure formed of the physical part 222 of the first insulating layer 220, the physical part 232 of the metal layer 230, the physical part 242 of the second insulating layer 240, and a part of a protection layer 250, but the disclosure is not limited thereto.

In the embodiment, the opening 224 of the first insulating layer 220, the opening 234 of the metal layer 230, and the opening 244 of the second insulating layer 240 of the anti-reflection structure ARS can be formed by using a same photomask, and the opening 224 of the first insulating layer 220, the opening 234 of the metal layer 230, and the opening 244 of the second insulating layer 240 can be substantially aligned, but the disclosure is not limited thereto.

In addition, in the embodiment, the display apparatus 10 further includes the protection layer 250 disposed on the anti-reflection structure ARS and located between the anti-reflection structure ARS and the first substrate 110. In particular, the protection layer 250 is further disposed in the opening 224 of the first insulating layer 220 and the opening 234 of the metal layer 230 of the anti-reflection structure ARS. In the embodiment, the protection layer 250 is further disposed in the opening 244 of the second insulating layer 240 of the anti-reflection structure ARS.

For example, in the embodiment, a material of the protection layer 250 may include $SiO_x$; the refractive index of $SiO_x$ ranges from 1.49 to 1.53; a thickness T4 of the protection layer 250 may be 500 Å; however, the disclosure is not limited thereto.

In the embodiment, the display panel DP may have a prospective window W (shown in FIG. 1), and the prospective window W is, for example, a drill hole penetrating the first substrate 110 and the second substrate 210, but the disclosure is not limited thereto. In other embodiments, the prospective window W may also be a region of the first substrate 110 and the second substrate 210 which is not provided with any light shielding structure.

In the embodiment, the display apparatus 10 further includes a polarizer 300. The polarizer 300 is disposed on the second substrate 210 of the display panel DP, and the second substrate 210 is located between the polarizer 300 and the anti-reflection structure ARS. The polarizer 300 may have an opening 302 overlapping with the prospective window W of the display panel DP. The display panel DP has a first region R1, a second region R2 and a third region R3. The polarizer 300 covers the first region R1; the prospective window W is located in the second region R2; the third region R3 is located between the first region R1 and the second region R2 and is not covered by the polarizer 300.

Since the anti-reflection structure ARS is disposed, the reflection index of the third region R3 of the display panel DP can be close to the reflection index of the polarizer 300. In this way, under the illumination of an ambient light beam L, the non-illuminated display apparatus 10 presents similar visual effects in the first region R1 and the third region R3 (for example, the display apparatus 10 overall appears uniformly black), and helps to improve the quality of the display apparatus 10.

In addition, since the first insulating layer 220 and the metal layer 230 of the anti-reflection structure ARS have the opening 224 and the opening 234, and the opening 224 and the opening 234 overlap with the pixel electrode 130, when the anti-reflection structure ARS is used to reduce the reflection of the ambient light beam L, the anti-reflection structure ARS does not excessively affect the transmittance of the display panel DP. The display apparatus 10 can achieve both high quality and high transmittance.

It should be noted that the following embodiments use the reference numerals and a part of the contents of the above embodiments. The same reference numerals are used to denote the same or similar elements, and the description of the same technical contents is omitted. For the description of the omitted part, reference may be made to the above embodiments, and are not described in the following embodiments.

Figure 3:
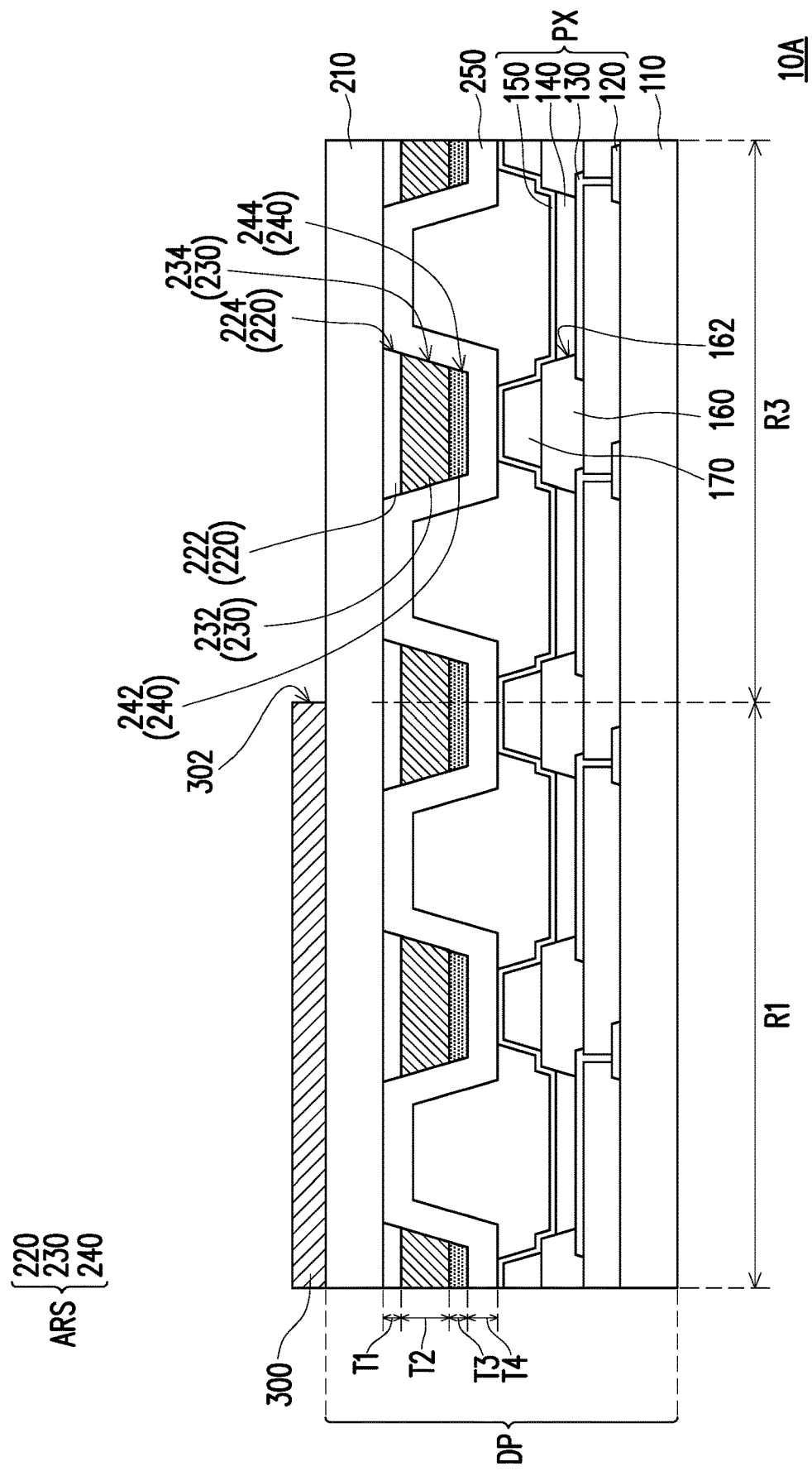
FIG. 3 is a schematic cross-sectional view of a display apparatus 10A according to an embodiment of the disclosure.

FIG. 3 is a schematic cross-sectional view of a display apparatus 10A according to an embodiment of the disclosure. The display apparatus 10A of FIG. 3 is similar to the display apparatus 10 of FIG. 2, and the difference between the two is that in the embodiment of FIG. 2, the thickness T2 of the metal layer 230 is smaller than the thickness T1 of the first insulating layer 220 and/or the thickness T3 of the second insulating layer 240; however, in the embodiment of FIG. 3, the thickness T2 of the metal layer 230 is greater than the thickness T1 of the first insulating layer 220 and/or the thickness T3 of the second insulating layer 240.

For example, in the embodiment of FIG. 3, the thickness T1 of the first insulating layer 220 is 300 Å, the thickness T2 of the metal layer 230 is 2500 Å, and the thickness T3 of the second insulating layer 240 is 300 Å, but the disclosure is not limited thereto.

Figure 4:
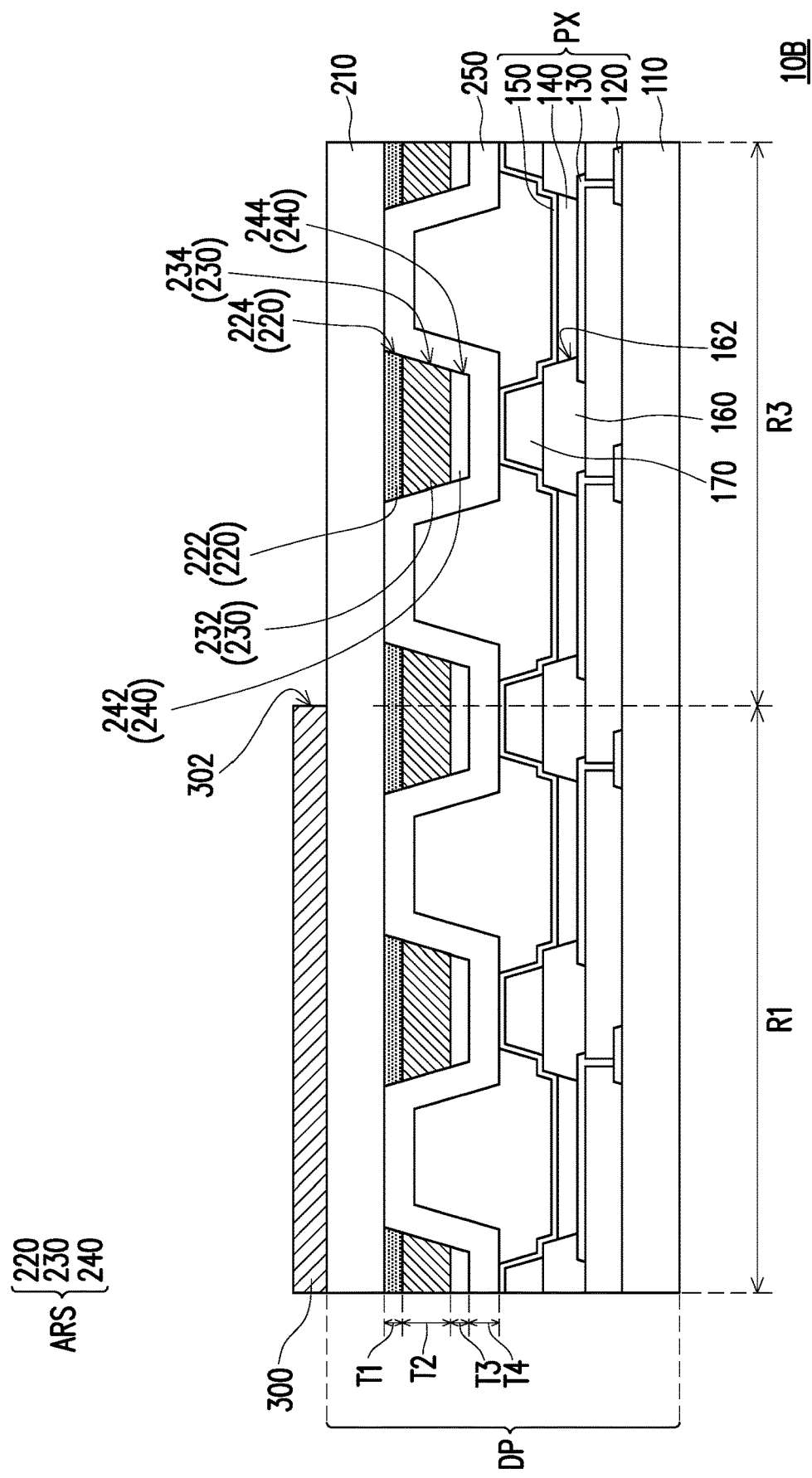
FIG. 4 is a schematic cross-sectional view of a display apparatus 10B according to an embodiment of the disclosure.

FIG. 4 is a schematic cross-sectional view of a display apparatus 10B according to an embodiment of the disclosure. The display apparatus 10B of FIG. 4 is similar to the display apparatus 10A of FIG. 3. Similarly, in the embodiment of FIG. 4, the thickness T1 of the first insulating layer 220 is 300 Å, the thickness T2 of the metal layer 230 is 2500 Å, and the thickness T3 of the second insulating layer 240 is 300 Å. The difference between the display apparatus 10B of FIG. 4 and the display apparatus 10A of FIG. 3 is that the material of the first insulating layer 220 of FIG. 4 is different from the material of the first insulating layer 220 of FIG. 3, and the material of the second insulating layer 240 of FIG. 4 is different from the material of the second insulating layer 240 of FIG. 3.

Specifically, in the embodiment of FIG. 3, the material of the first insulating layer 220 includes $SiN_x$, the material of the metal layer 230 includes Mo, and the material of the second insulating layer 240 includes SRO; however, in the embodiment of FIG. 4, the material of the first insulating layer 220 includes SRO, the material of the metal layer 230 includes Mo, and the material of the second insulating layer 240 includes $SiN_x$.

Figure 5:
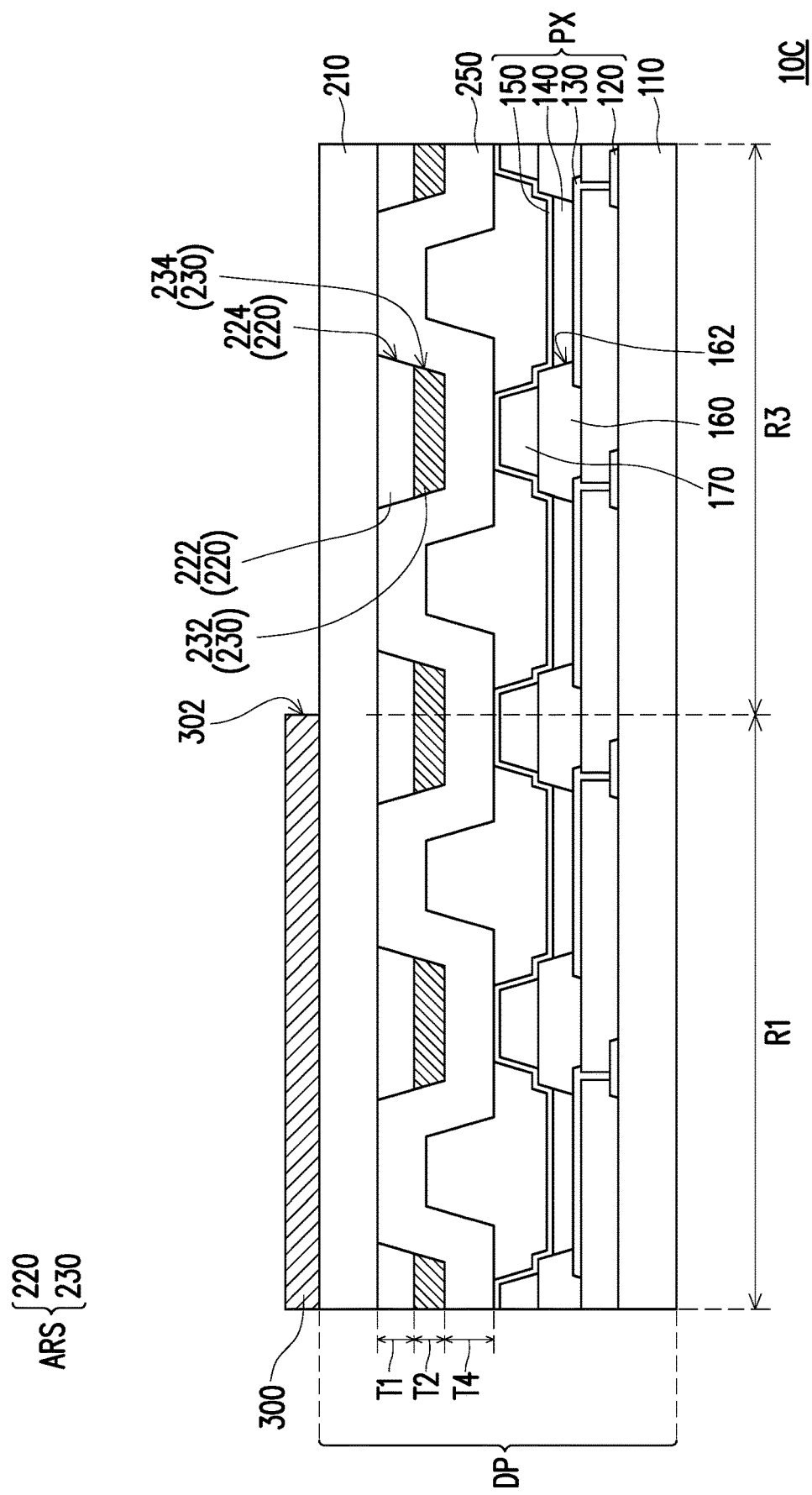
FIG. 5 is a schematic cross-sectional view of a display apparatus 10C according to an embodiment of the disclosure.

FIG. 5 is a schematic cross-sectional view of a display apparatus 10C according to an embodiment of the disclosure. The display apparatus 10C of FIG. 5 is similar to the display apparatus 10 of FIG. 2, and the difference between the two is that the anti-reflection structure ARS of FIG. 5 is different from the anti-reflection structure ARS of FIG. 2.

The anti-reflection structure ARS of FIG. 5 may not include the second insulating layer 240 of the anti-reflection structure ARS of FIG. 2. Referring to FIG. 5, specifically, in the embodiment, the anti-reflection structure ARS includes the first insulating layer 220 and the metal layer 230. The first insulating layer 220 is disposed between the second substrate 210 and the metal layer 230. In the embodiment, the material of the first insulating layer 220 includes molybdenum oxide ($MoO_x$), the material of the metal layer 230 includes Mo, and the material of the protection layer 250 includes $SiO_x$; the thickness T1 of the first insulating layer 220 is 850 Å, the thickness T2 of the metal layer 230 is 500 Å, and the thickness T4 of the protection layer 250 is 2500 Å; however, the disclosure is not limited thereto.

Figure 6:
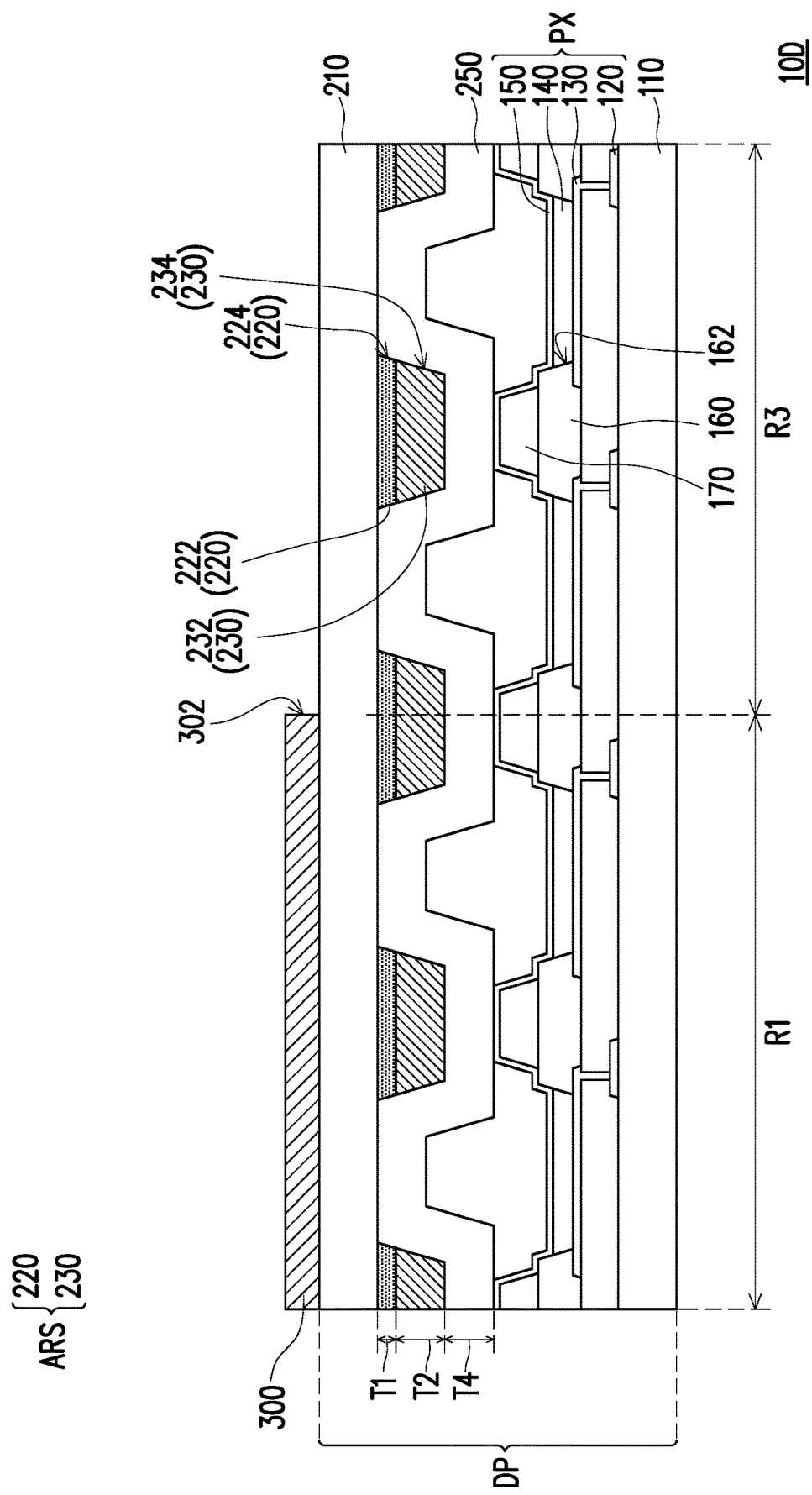
FIG. 6 is a schematic cross-sectional view of a display apparatus 10D according to an embodiment of the disclosure.

FIG. 6 is a schematic cross-sectional view of a display apparatus 10D according to an embodiment of the disclosure. The display apparatus 10D of FIG. 6 is similar to the display apparatus 10 of FIG. 2, and the difference between the two is that the anti-reflection structure ARS of FIG. 6 is different from the anti-reflection structure ARS of FIG. 2.

The anti-reflection structure ARS of FIG. 6 may not include the second insulating layer 240 of the anti-reflection structure ARS of FIG. 2. Referring to FIG. 6, specifically, in the embodiment, the anti-reflection structure ARS includes the first insulating layer 220 and the metal layer 230. The first insulating layer 220 is disposed between the second substrate 210 and the metal layer 230. In the embodiment, the material of the first insulating layer 220 includes SRO, the material of the metal layer 230 includes molybdenum Mo, and the material of the protection layer 250 includes $SiO_x$; the thickness T1 of the first insulating layer 220 is 300 Å, the thickness T2 of the metal layer 230 is 2500 Å, and the thickness T4 of the protection layer 250 is 2500 Å; however, the disclosure is not limited thereto.

Figure 7:
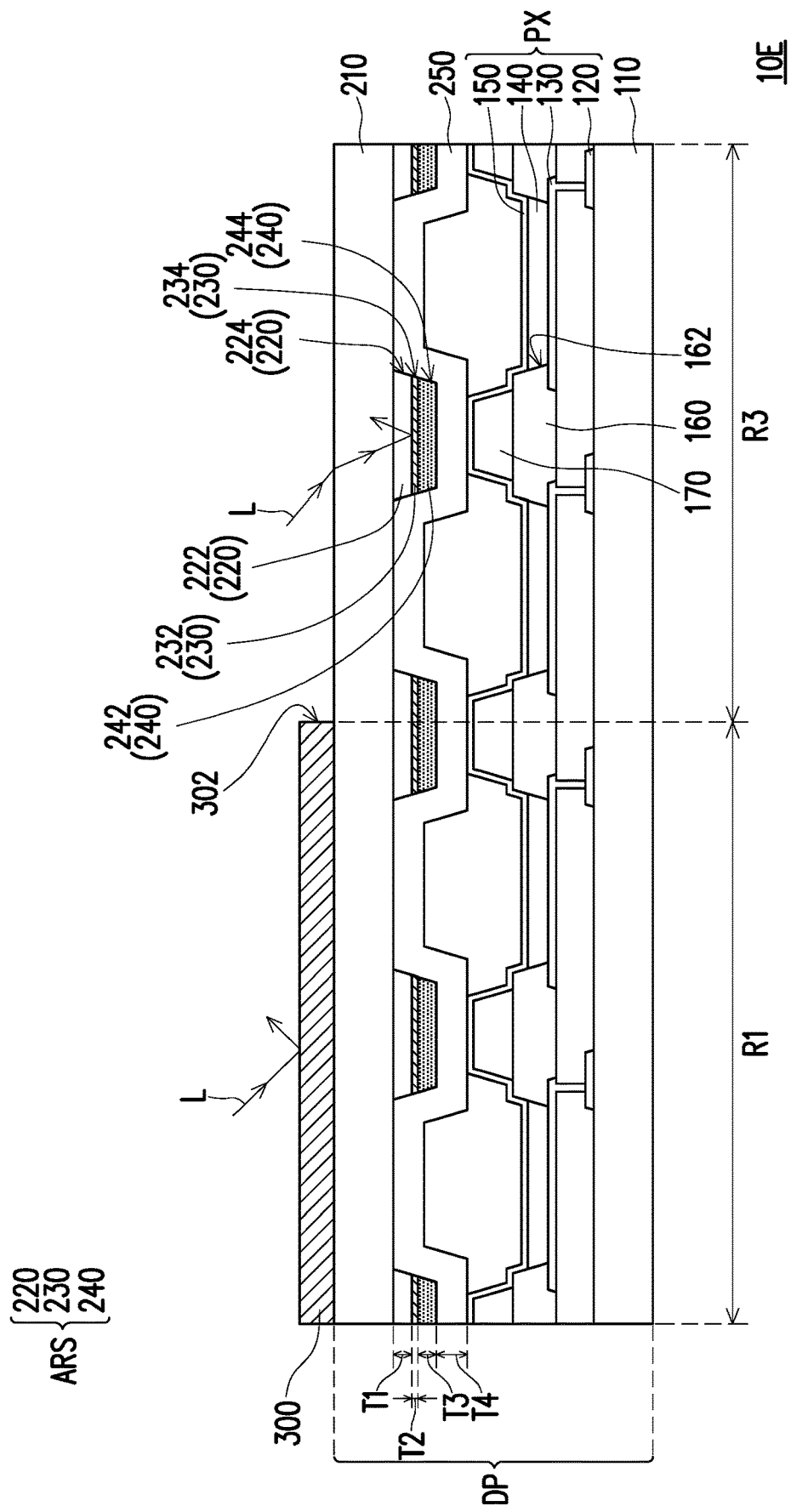
FIG. 7 is a schematic cross-sectional view of a display apparatus 10E according to an embodiment of the disclosure.

FIG. 7 is a schematic cross-sectional view of a display apparatus 10E according to an embodiment of the disclosure. The display apparatus 10E of FIG. 7 is similar to the display apparatus 10 of FIG. 2, and the difference between the two is that the material of the first insulating layer 220 of the anti-reflection structure ARS of FIG. 2 and the material of the first insulating layer 220 of the anti-reflection structure ARS of FIG. 7 are different. Specifically, in the embodiment of FIG. 7, the anti-reflection structure ARS includes the first insulating layer 220, the metal layer 230, and the second insulating layer 240 stacked in sequence. The material of the first insulating layer 220 includes SRO, the material of the metal layer 230 includes Mo, and the material of the second insulating layer 240 includes SRO.

Figure 8:
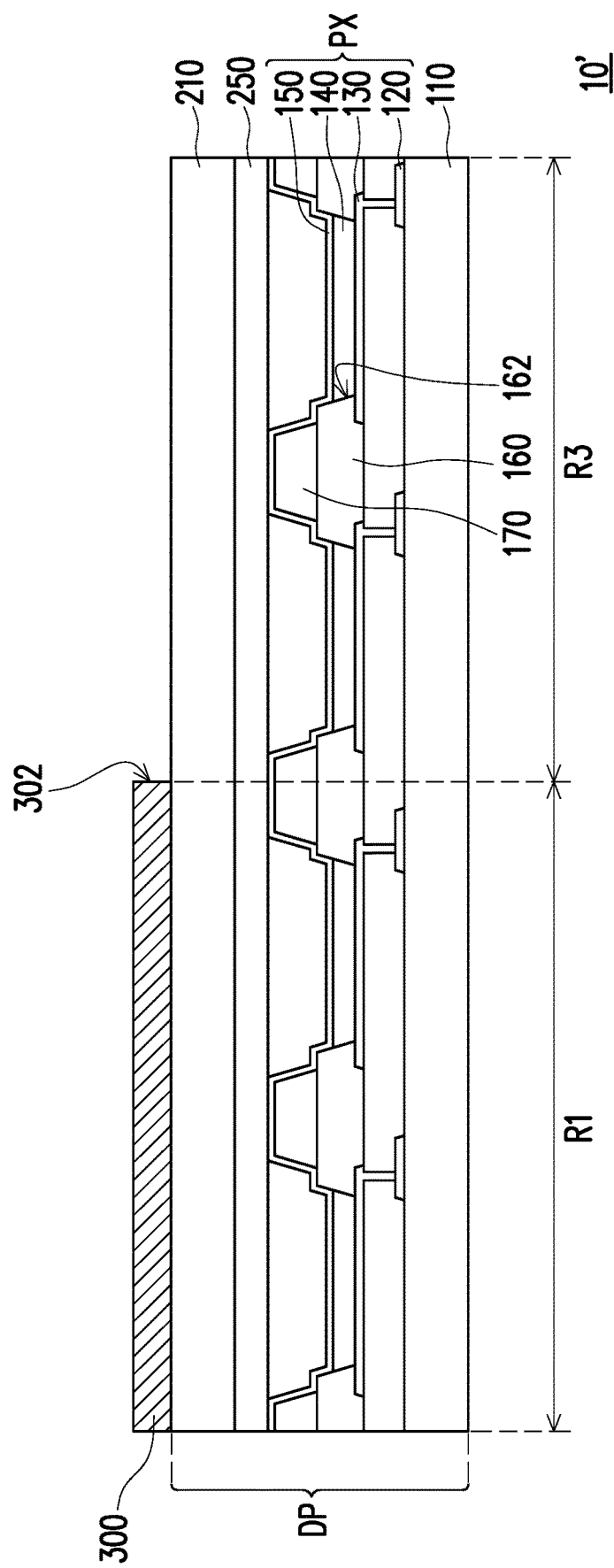
FIG. 8 is a schematic cross-sectional view of a display apparatus 10' according to a comparative example of the disclosure.

FIG. 8 is a schematic cross-sectional view of a display apparatus 10' according to a comparative example of the disclosure. The display apparatus 10' of FIG. 8 is similar to the display apparatus 10 of FIG. 2, and the difference between the two is that the display apparatus 10' of FIG. 8 does not include the anti-reflection structure ARS of the display apparatus 10 of FIG. 2.

Figure 9:
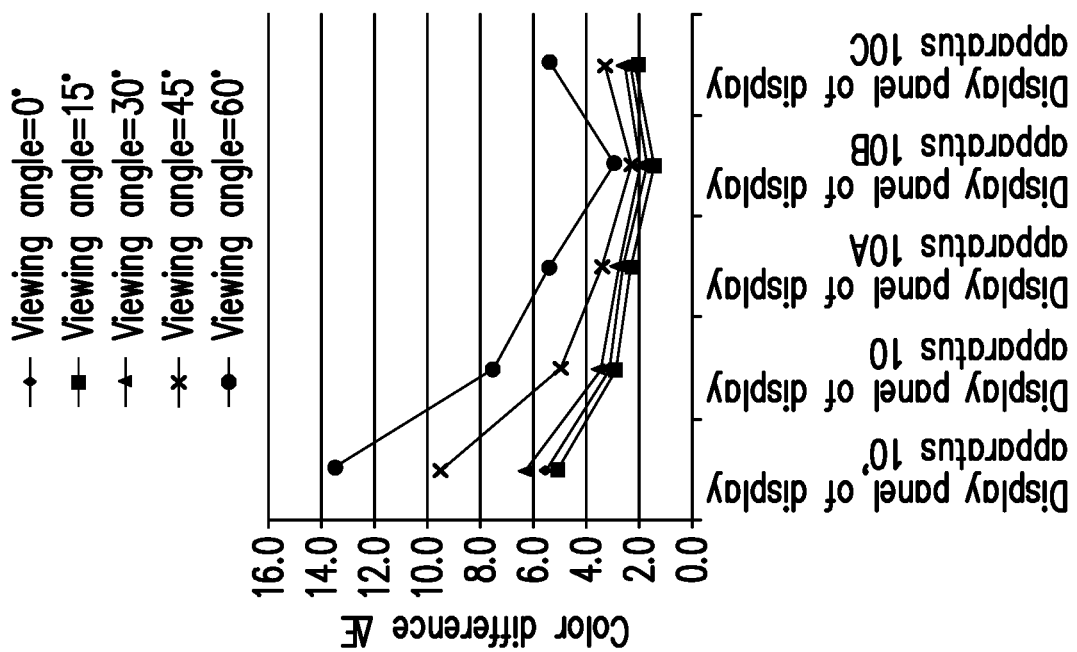
FIG. 9 shows reflection index of the display panel DP of the display apparatus 10' according to the comparative example at each viewing angle and reflection index of the display panels DP of the display apparatus 10, 10A, 10B, and 10C according to each embodiment at each viewing angle.

FIG. 9 shows reflection index of the display panel DP of the display apparatus 10' according to the comparative example at each viewing angle and reflection index of the display panels DP of the display apparatus 10, 10A, 10B, and 10C according to each embodiment at each viewing angle.

Referring to FIG. 9, at each viewing angle, the reflection index of the display panels DP of the display apparatus 10, 10A, 10B, and 10C according to each embodiment are all lower than the reflection index of the display panel DP of the display apparatus 10' according to the comparative example. In particular, at a large viewing angle (for example, 60°), the reflection index of the display panels DP of the display apparatus 10, 10A, 10B, 10C according to each embodiment are significantly lower than the reflection index of the display panel DP of the display apparatus 10' according to the comparative example.

Figure 10:
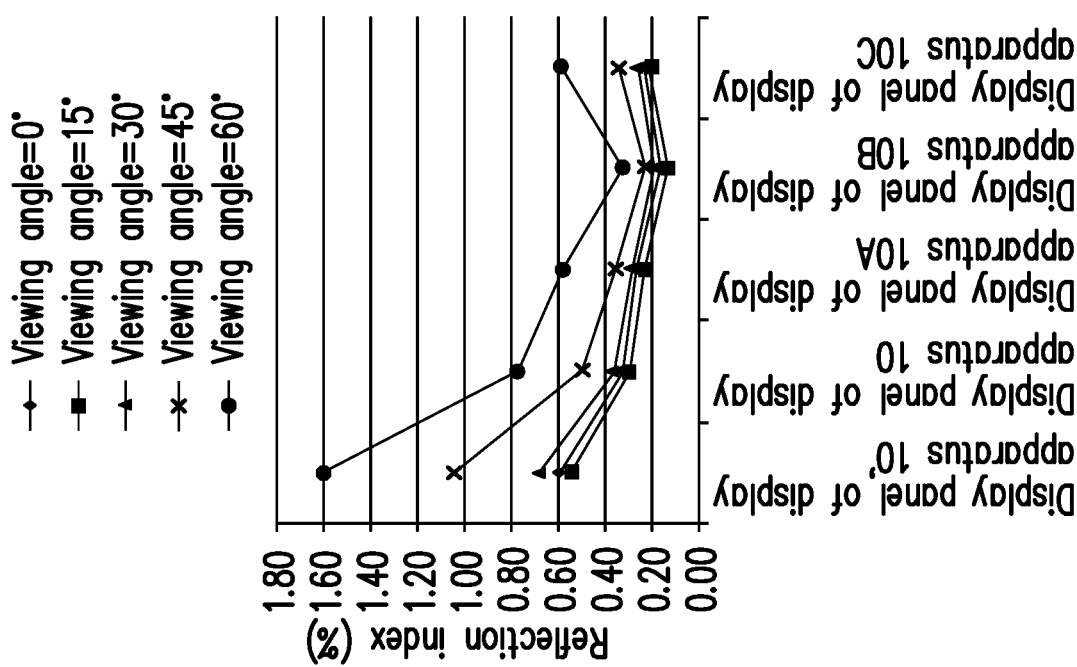
FIG. 10 shows color difference ΔE between color coordinates (L*, a*, and b*) of the display panel DP of the display apparatus 10' according to the comparative example and standard black color coordinates (0, 0, 0) at each viewing angle, and color difference ΔE between color coordinates (L*, a*, b*) of the display panels DP of the display apparatus 10, 10A, 10B, and 10C according to each embodiment and standard black color coordinates (0, 0, 0) at each viewing angle.

FIG. 10 shows color difference ΔE between color coordinates (L*, a*, and b*) of the display panel DP of the display apparatus 10' according to the comparative example and standard black color coordinates (0, 0, 0) at each viewing angle, and color difference ΔE between color coordinates (L*, a*, b*) of the display panels DP of the display apparatus 10, 10A, 10B, and 10C according to each embodiment and standard black color coordinates (0, 0, 0) at each viewing angle, and $\Delta E = \sqrt{\Delta L^2 + \Delta a^2 \Delta b^2}$.

Referring to FIG. 10, comparing with the display panel DP of the display apparatus 10' according to the comparative example, at each viewing angle, the color difference ΔE between the color coordinates (L*, a*, b*) of the display panels DP of the display apparatus 10, 10A, 10B, and 10C according to each embodiment and the standard black color coordinates (0, 0, 0) are all smaller. In particular, at a large viewing angle (for example, 60°), the color difference ΔE of the display panels DP of the display apparatus 10, 10A, 10B, and 10C according to each embodiment are significantly lower than the color difference ΔE of the display panel DP of the display apparatus 10' according to the comparative example.

The data in FIG. 9 and FIG. 10 proves that since the anti-reflection structure ARS is disposed, the reflection index and the color difference ΔE with the standard black of the display panels DP of the display apparatus 10, 10A, 10B, and 10C according to each embodiment of the disclosure are both low. Therefore, the first region R1 of the display apparatus 10, 10A, 10B, 10C where the polarizer 300 is attached and the third region R3 of the display apparatus 10, 10A, 10B, 10C where the polarizer 300 is not attached present similar visual effects (for example, the display apparatus 10, 10A, 10B, 10C overall appear uniformly black), and the display apparatus 10, 10A, 10B, and 10C are high-quality.

What is claimed is:

1. A display apparatus, comprising a display panel, wherein the display panel comprises:
   a first substrate;
   a pixel structure disposed on the first substrate, and comprising an active element, a pixel electrode electrically connected to the active element, an organic electroluminescence pattern disposed on the pixel electrode and a common electrode disposed on the organic electroluminescence pattern;
   a second substrate disposed opposite to the first substrate; and
   an anti-reflection structure disposed on the second substrate, and being located between the first substrate and the second substrate, wherein the anti-reflection structure comprises:
   a first insulating layer disposed on the second substrate; and
   a metal layer disposed on the first insulating layer, wherein the first insulating layer is located between the second substrate and the metal layer, the first insulating layer has an opening, the metal layer has an opening, and the opening of the first insulating layer and the opening of the metal layer overlap with the pixel electrode;

wherein the display panel has a light emitting region where the pixel electrode is located, in the light emitting region, no metal layer is provided between the common electrode and the second substrate.

2. The display apparatus according to claim 1, wherein a material of the first insulating layer comprises molybdenum oxide or silicon-rich oxide, and a material of the metal layer comprises molybdenum.

3. The display apparatus according to claim 1, wherein the anti-reflection structure further comprises:

a second insulating layer disposed on the metal layer, wherein the metal layer is located between the first insulating layer and the second insulating layer.

4. The display apparatus according to claim 3, wherein the second insulating layer has an opening, and the opening of the second insulating layer overlaps with the opening of the metal layer.

5. The display apparatus according to claim 4, wherein the opening of the second insulating layer and the opening of the metal layer are substantially aligned.

6. The display apparatus according to claim 3, wherein a material of one of the first insulating layer and the second insulating layer comprises silicon nitride, a material of the other one of the first insulating layer and the second insulating layer comprises silicon-rich oxide, and a material of the metal layer comprises molybdenum.

7. The display apparatus according to claim 3, wherein a material of the first insulating layer comprises silicon-rich oxide, a material of the metal layer comprises molybdenum, and a material of the second insulating layer comprises silicon-rich oxide.

8. The display apparatus according to claim 1, wherein a thickness of the metal layer is greater than a thickness of the first insulating layer.

9. The display apparatus according to claim 1, further comprising:

a protection layer disposed on the anti-reflection structure, and being located between the anti-reflection structure and the first substrate, wherein the protection layer is further disposed in the opening of the first insulating layer and the opening of the metal layer.

10. The display apparatus according to claim 1, further comprising:

a polarizer disposed on the second substrate of the display panel, wherein the second substrate is located between the polarizer and the anti-reflection structure, the display panel has a first region and a second region, the polarizer covers the first region, and the polarizer does not cover the second region.

* * * * *